United States Patent [19]

David et al.

[11] Patent Number: 4,503,449
[45] Date of Patent: Mar. 5, 1985

[54] V-MOS FIELD EFFECT TRANSISTOR

[75] Inventors: Gerard R. David, Cambes en Plaine; Jean-Claude Vallee, Herouville Saint Clair; Jacky Caret, Caen, all of France

[73] Assignee: U.S. Philips Corporation, New York, N.Y.

[21] Appl. No.: 416,725

[22] Filed: Sep. 10, 1982

[30] Foreign Application Priority Data

Sep. 14, 1981 [FR] France ................. 81 17320

[51] Int. Cl.³ ............... H01L 29/78; H01L 29/08
[52] U.S. Cl. ..................... 357/23.4; 357/60; 357/54; 357/55; 357/23.15
[58] Field of Search .......... 357/23 VD, 23 R, 60, 357/23 I, 54, 55

[56] References Cited

U.S. PATENT DOCUMENTS

| 4,225,879 | 9/1980 | Vinson | 357/23 VD |
| 4,271,418 | 6/1981 | Hiltpold | 357/55 |
| 4,272,302 | 6/1981 | Jhabvala | 357/60 |
| 4,295,924 | 10/1981 | Garnache et al. | 357/55 |
| 4,316,203 | 2/1982 | Tohgei | 357/23 VD |
| 4,329,705 | 5/1982 | Baker | 357/60 |
| 4,398,339 | 8/1983 | Blanchard et al. | 357/55 |
| 4,404,735 | 9/1983 | Sakurai | 357/55 |
| 4,407,058 | 10/1983 | Fatula et al. | 357/23 VD |
| 4,409,609 | 10/1983 | Fukuda | 357/55 |

FOREIGN PATENT DOCUMENTS

| 2803431 | 8/1979 | Fed. Rep. of Germany | 357/23 VD |
| 0091874 | 7/1980 | Japan | 357/23 VD |

Primary Examiner—William D. Larkins
Assistant Examiner—Charles S. Small, Jr.
Attorney, Agent, or Firm—Robert T. Mayer; Steven R. Biren

[57] ABSTRACT

A field effect transistor of the V-MOS type has a layer-shaped first region (3) of a first conductivity type, a subjacent second region (2, 1) of the second conductivity type and an island-shaped zone (4) of the second conductivity type. A V-shaped groove extends through the zone (4) and the first region (3) into the second region (2, 1) and is coated with an insulating layer (6) and a gate electrode layer (8). According to the invention, an insulating filler material (7) is present on the lower side of the groove (5) between the gate electrode (8) and the bottom of the groove (5) in order to increase the breakdown voltage.

9 Claims, 1 Drawing Figure

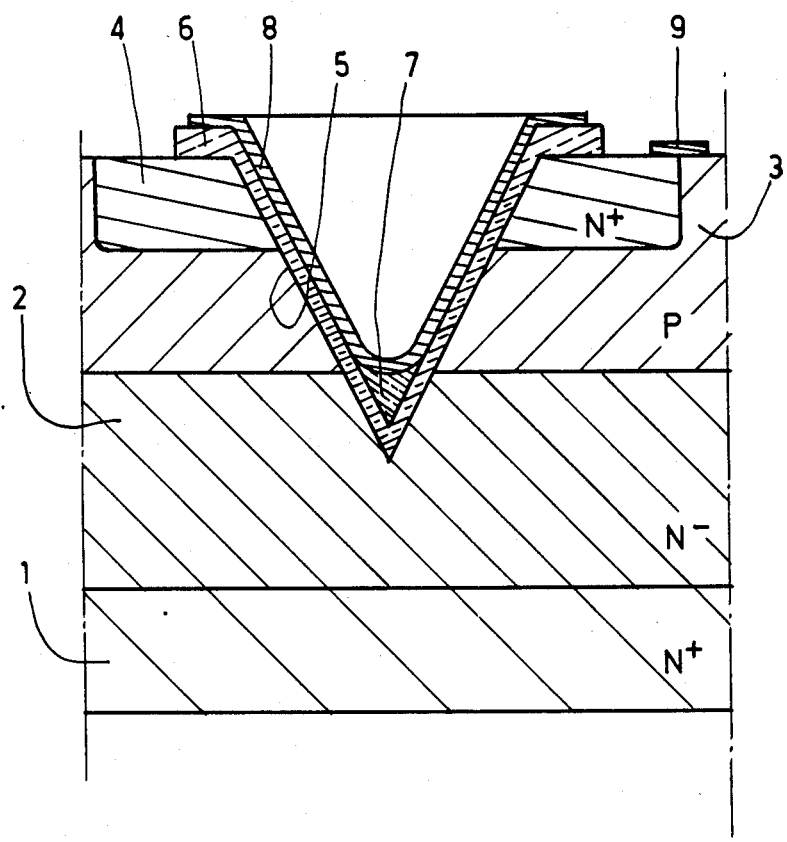

V-MOS FIELD EFFECT TRANSISTOR

BACKGROUND OF THE INVENTION

The invention relates to an insulated gate field effect transistor comprising a semiconductor body having a layer-shaped first region of a first conductivity type adjoining a surface, an underlying layer-shaped second region of the second opposite conductivity type, which forms a p-n junction with the first region, and at least an island-shaped zone of the second conductivity type which adjoins the surface and which is surrounded by the first region, at least a groove of V-shaped cross-section being provided in the surface, which extends through the island-shaped zone and the first region into the second region and the wall of which is coated with an electrically insulating layer, on which a conductive layer is provided which forms a gate electrode of the field effect transistor, the island-shaped zone and the second region being provided with source and drain electrodes.

The invention also relates to a method of manufacturing such a field effect transistor. A field effect transistor of the kind described is known from "Electronics", June 22$^{nd}$ 1978, p. 105–112.

In this transistor type, designated as a V-MOS transistor, the walls and bottom of the groove or grooves are entirely coated with an insulating layer, which is coated with a gate electrode layer, which generally also is situated above a part of the surface of the semiconductor body.

It is known that the insulating layer must then be sufficiently thin to obtain in the "ON" state a high current sensitivity and a low resistance, but also sufficiently thick to guarantee a high breakdown voltage. The disturbance of the field lines at the bottom of the groove or grooves in fact becomes larger as the thickness of the insulating layer is made smaller.

In the known methods of manufacturing V MOS transistors, it is difficult to satisfy these two criteria simultaneously.

SUMMARY OF THE INVENTION

The invention has for its object to provide high current sensitivity, low resistance and high breakdown voltage.

According to the invention, a field effect transistor of the kind described above is characterized in that an electrically insulating filler material is provided in the lower part of the groove between the gate electrode and the bottom of the groove.

Due to the difference in the overall thickness of the gate dielectric below the gate electrode on the upper side and on the lower side of the groove, which difference is caused by the provision of the filler material, both a high current sensitivity and a high breakdown voltage at the bottom of the groove can be achieved.

Although in principle the insulating filler material could be provided between the wall of the groove and the insulating layer, the insulating filler material is preferably provided between the insulating layer and the gate electrode. By means of the usual techniques, the quality of the groove walls at the area of the inversion layer to be formed as well as a sufficient homogeneity and imperviousness of the insulating layer can be guaranteed most successfully in this manner.

The insulating filler material is preferably provided over a thickness which is at least equal to the distance over which the groove extends into the second region. Advantageously, the filler material is provided up to a level which substantially corresponds to that of the pn-junction between the first and the second regions so that it is not present between the gate electrode and the semiconductor surface at the area of the inversion layer to be formed in the first region, but has a favorable influence on the breakdown voltage at the bottom of the groove.

In a typical case, in which the thickness of the insulating layer is approximately 0.2 μm, the depth over which the grooves extend into the second region and the thickness of the insulating filler material amount to at least 1 μm.

The insulating filler material preferably comprises a glass which in general is obtained pyrolytically, the said glass preferably being doped with boron or with phosphorous in order to improve its mechanical and thermal properties.

The invention also relates to a method of manufacturing the field effect transistor. This method is characterized in that a semiconductor layer of the first conductivity type is provided on a region of the second conductivity type, while at least an island-shaped zone of the second conductivity type is provided in this layer; in that then in the island-shaped zone at least a V-shaped groove is formed by etching, which groove extends through the zone and through the semiconductor layer of the first conductivity type into the region of the second conductivity type, and in that subsequently at least on the wall of the groove there is provided an insulating layer, which is coated with a conductive gate electrode layer, an insulating filler material being provided in the lower part of the groove over a thickness which is at least equal to the distance over which the groove extends into the region of the second conductivity type.

This method provides the possibility of increasing the thickness of the insulating film in the region in which a disturbance of the field lines influences the resistance of the field effect transistor to breakdown.

According to a preferred embodiment, the method in accordance with the invention is characterized in that the insulating filler material is provided by coating the surface of the semiconductor body with a suspension of a glass in an alcoholic solution and by causing this suspension to penetrate into the lower part of the groove or grooves by centrifugation, whereupon the volatile parts of the mixture are removed by heating.

The viscosity of the solution and the centrifuging conditions are chosen so that only the bottom of the grooves and the lower part of the sides thereof are coated with a glass layer. The glass mixture may likewise contain a dopant, for example, boron or phosphorus. The filler material is preferably provided after the insulating layer.

Considering the temperature at which the insulating filler material is generally provided and baked out (400° to 600° C.), which temperature is lower than the temperature (600° to 900° C.) required for the formation of the insulating layer (normally an oxide film), it is desirable to proceed in the aforementioned order of succession in order to avoid any damage of the insulating filler material, which damage may take the form of fissures.

BRIEF DESCRIPTION OF THE DRAWING

The invention will now be described more fully with reference to the drawing, the FIGURE of which shows diagrammatically in cross-section a V-MOS transistor according to the invention.

DESCRIPTION OF THE PREFERRED EMBODIMENTS

In this example, the field effect transistor consists of a substrate 1, for example, of the n+-type, on which an n−-type layer 2 and a p-type layer 3 are disposed. An island-shaped zone 4 of the same conductivity type as the layer 2, of the n-type, is locally provided in the layer 3, i.e. the "first region". Further, provision is made of one or more grooves 5, the pattern of which is chosen in dependence upon the desired properties of the field effect transistor. The groove 5 extends through the zone 4 and the layer 3 into the layer 2, for example, to a depth of 1 μm. The layers 1 and 2 together constitute the "second region".

An oxide film 6 having a very small thickness, in this example approximately 0.2 μm, is provided both over a part of the surface of the semiconductor body and over the walls and the bottom of the groove 5.

According to the invention, an electrically insulating filler material 7 is provided in the lower part of the groove 5 between the gate electrode 8 and the bottom of the groove, in this example over a thickness which is at least equal to the distance over which the groove 5 extends into the layer 2. In this example, the filler material 7 consists of glass, which is enclosed between the insulating layer 6 and the gate electrode layer 8, in this example of metal.

The starting material in the manufacture of this field effect transistor is a substrate of n+-type silicon, on which are successively vapor-deposited epitaxial layers 2 and 3, which are doped with arsenic or phosphorus (layer 2) and with boron (layer 3), respectively.

The zone 4 is then formed by means of local diffusion of donor atoms through a suitable mask. By means of photo-etching the groove (or grooves) 5 is (are) then provided through the zone 4 and the layer 3 into the layer 2.

On the wall of the groove 5 and on a part of the surface of the semiconductor body, especially on the zone 4, the oxide layer 6 is formed by means of thermal oxidation at a temperature of at least 600° C., which layer in this example has a thickness of approximately 0.2 μm.

According to the invention, a mixture consisting of glass suspended in an alcoholic solution is then applied; by means of centrifugation, the said mixture is concentrated and applied on the lower side of the grooves 5. By baking out the mixture at a temperature of approximately 400° C., the combustible substances are removed from the mixture so that only a homogeneous layer 7 remains.

During the last processing step, a gate electrode layer, in this case a metal layer 8, for example of aluminum, is provided on the surface of the semiconductor body and on the walls and the bottom of the groove 5, which layer is then etched into the desired pattern. This layer is provided by means of known vapor-deposition techniques. Instead of a gate electrode layer of metal, another material, for example, doped polycrystalline or amorphous silicon, could alternatively be used.

Simultaneously with the metal layer 8 a contact surface 9 is provided, which shortcircuits the layer 3 with the zone 4 so that a V-MOS transistor is obtained, the source electrode of which is constituted by the zone 4, the drain zone of which is constituted by the layer 2, the gate electrode of which is constituted by the metal layer 8 and the channel of which is constituted an inversion layer at the surface of the layer 3 inside the groove 5, which inversion layer is influenced by the potential of the gate electrode.

What is claimed is:

1. An insulated gate field effect transistor comprising a semiconductor body having a layer-shaped first region of a first conductivity type adjoining a surface, an underlying layer-shaped second region of the second opposite conductivity type, which form a p-n junction with the first region, and an island-shaped zone of the second conductivity type which adjoins the surface and which is surrounded by the first region, at least one groove of V-shaped cross-section in the surface, which extends through the island-shaped zone and the first region into the second region and the walls of which are coated with an electrically insulating layer, a conductive layer being provided on said insulating layer and forming a gate electrode of the field effect transistor, the island-shaped zone and the second region being provided with source and drain electrodes, characterized in that an electrically insulating filler material different from that of said electrically insulating layer is provided in the lower part of the groove between the gate electrode and the bottom of the groove.

2. A field effect transistor as claimed in claim 1, characterized in that the insulating filler material is provided between the insulating layer and the gate electrode.

3. A field effect transistor as claimed in claim 1 or 2, characterized in that the insulating filler material is provided over a thickness which is at least equal to the distance over which the groove extends into the second region.

4. A field effect transistor as claimed in claim 1 or 2 characterized in that the insulating filler material is provided up to a level which substantially corresponds to that of the p-n junction between the first and the second regions.

5. A field effect transistor as claimed in claim 1 or 2 characterized in that the second region comprises a semiconductor layer adjoining the first region and a subjacent substrate of the second conductivity type having a higher doping concentration than that of the semiconductor layer.

6. A field effect transistor as claimed in claim 1 or 2 characterized in that the thickness of the insulating layer is approximately 0.2 μm and in that the distance over which the groove extends into the second region and the thickness of the insulating filler material above the lower side of the groove are each at least 1 μm.

7. A field effect transistor as claimed in claim 1 or 2, characterized in that the insulating filler material comprises glass.

8. A field effect transistor as claimed in claim 7, characterized in that the glass is doped with boron.

9. A field effect transistor as claimed in claim 7, characterized in that the glass is doped with phosphorus.

* * * * *